United States Patent
Moondanos et al.

(10) Patent No.: US 6,564,358 B2
(45) Date of Patent: May 13, 2003

(54) METHOD AND SYSTEM FOR FORMAL VERIFICATION OF A CIRCUIT MODEL USING BINARY DECISION DIAGRAMS

(75) Inventors: John Moondanos, Folsom, CA (US); Carl J. Seger, Hillsboro, OR (US); Ziyad Hanna, Haifa (IL); Daher Adil Kaiss, Nahif Village (IL)

(73) Assignee: Intel Corporation, Santa Clara, CA (US)

( * ) Notice: Subject to any disclaimer, the term of this patent is extended or adjusted under 35 U.S.C. 154(b) by 160 days.

(21) Appl. No.: 09/734,380

(22) Filed: Dec. 11, 2000

(65) Prior Publication Data

US 2002/0108093 A1 Aug. 8, 2002

(51) Int. Cl.[7] .............................. G06F 17/50; G06F 9/45
(52) U.S. Cl. ................................................ 716/5; 716/4
(58) Field of Search .......................................... 716/5, 4

(56) References Cited

U.S. PATENT DOCUMENTS

| 5,754,454 A | * | 5/1998 | Pixley et al. ................ 702/123 |
| 5,937,183 A | | 8/1999 | Ashar et al. ........... 395/500.34 |
| 6,035,107 A | * | 3/2000 | Kuehlmann et al. ........... 716/1 |

OTHER PUBLICATIONS

C. Leonard Berman et al., Functional Comparison of Logic Designs for VLSI Circuits, 1989 IEEE International Conference on Computer–Aided Design, pp. 456–459, Nov. 1989.*

F. Krohm et al., The Use of Random Simulation in Formal Verification, 1996 IEEE International Conference on Computer Design: VLSI in Computers and Processors, pp. 371–376, Oct. 1996.*

Z. Khasidashvili et al., An Enhanced Cup–Points Algorithm in Formal Equivalence Verification, 6th IEEE International High–Level Design Validation and Test Workshop, pp. 171–176, Nov. 2001.*

R. Mukherjee et al., Efficient Combinational Verification Using BDDs and A Hash Table, 1997 IEEE International Symposium on Circuits and Systems, pp. 1025–1028, Jun. 1997.*

Z. Khasidashvili et al., An Enhanced Cut–points Algorithm in Formal Equivalence Verification, 6th IEEE International High–Level Design Validation and Test Workshop, pp. 171–176, Nov. 2001.*

Bryant, R.E., "Graph–Based Algorithms for Boolean Function Manipulation", *IEEE Transactions on Computers, C–35* (8), pp. 677–691, (1986).

(List continued on next page.)

*Primary Examiner*—Matthew Smith
*Assistant Examiner*—A. M. Thompson
(74) *Attorney, Agent, or Firm*—Schwegman, Lundberg, Woessner & Kluth, P.A.

(57) ABSTRACT

The present invention provides a method and system for comparing a pair of circuit models without the need for performing a false negative check when cut-points are introduced. An exemplary method includes generating a BDD for each of a plurality of signals of each circuit model from an initial cut-point frontier towards an output of each circuit model until a BDD of one of the plurality of signals reaches a predetermined maximum size, selecting a new cut-point signal frontier, and generating a normalized function for each cut-point signal on the new cut-point frontier of each circuit model.

28 Claims, 5 Drawing Sheets

OTHER PUBLICATIONS

Fujita, M., et al., "Evaluation and Improvement of Boolean Comparison Method base on binary decision diagrams", *IEEE Internationa Conference on Computer–Aided Design, ICCAD–88 Digest of Technical Papers*, 2–5, (Nov. 1988).

Kuehlman, A., et al., "Equivalence Checking Using Cuts and Heaps", *34th Design and Automation Conference Proceedings*, (1997).

Matsunaga, Y., "An Efficient Equivalence Checker for Combinational Circuits", *33rd Design and Automation Conference proceedings 1996*, 629–634, (1996).

Reddy, S.M., et al., "Novel Verification Framework Combining Structural and OBDD Methods in a Synthesis Environment", *32 Design Automation Conference Proceedings 1995*, 414–419, (1995).

Rudell, R., "Dynamic Variable Ordering for Ordered Binary Decision Diagrams", *1993 IEEE/ACM International Conference on Computer–Aided Design, Digest of Technical Papers*, IEEE Comput. Soc. Press, 42–47, (Nov. 1993).

* cited by examiner

METHOD AND SYSTEM FOR FORMAL VERIFICATION OF A CIRCUIT MODEL USING BINARY DECISION DIAGRAMS

FIELD

The present invention relates to the field of computer systems, and more specifically to a method and system for formal verification of a circuit model.

BACKGROUND

One method of verifying a circuit design is called formal verification. Formal verification is the use of mathematical techniques to formally (i.e. without simulating circuit input vectors) compare circuit design models which are at different levels of abstraction to establish logic functionality equivalence between the two models. For example, formal verification is used to compare the specification of a logic circuit in some hardware description language (HDL) against its implementation as a schematic model.

Formal verification tools are often based on binary decision diagrams (BDDs). BDDs are directed acyclic graph structures that encode the value of a boolean logic function for all possible input value combinations. BDDs simplify the task of boolean function equivalence, since BDDs have efficient algorithms for equivalence checking and other boolean operations.

However, BDD techniques suffer from exponential memory requirements since the size of the BDD representing a given circuit can grow exponentially relative to the inputs of the circuit. To overcome this, solutions based on a divide-and-conquer approach have been developed. These techniques attempt to partition the specification and implementation circuit models along frontiers of equivalent signal pairs called cut-points. The resulting sub-circuit partitions of each circuit model are independently analyzed, thus breaking the verification task into manageable units.

However, one problem that arises when introducing cut-points into circuit models is that the verification method may return a false negative. False negatives appear when the technique that compares the two circuits classifies them as different, while in reality they are not. Thus, cut-point based formal verification techniques include a process of eliminating false negatives by attempting to determine whether the corresponding circuit outputs are truly different or the algorithm produced a false negative. This extra step is time-consuming.

Accordingly, for the reasons stated above, and for other reasons stated below which will be appreciated by those skilled in the art upon reading and understanding the present specification, there is a need in the art for a method of verifying circuit models which is faster and permits the verification of more complex circuits within a formal mathematical framework.

DESCRIPTION OF THE EMBODIMENTS

In the following detailed description, reference is made to the accompanying drawings that form a part hereof, and in which are shown by way of illustration specific embodiments in which the invention may be practiced. It is understood that other embodiments may be utilized and changes may be made without departing from the scope of the present invention.

Some portions of the detailed descriptions which follow are presented in terms of algorithms and symbolic representations of operations on data bits within a computer or processor memory. These algorithmic descriptions and representations are used by those skilled in the data processing arts to most effectively convey the substance of their work to others skilled in the art. An algorithm is here, and generally, conceived to be a self-consistent sequence leading to a desired result. The sequence requires physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Unless specifically stated otherwise as apparent from the following discussions, it is appreciated that throughout the present invention, discussions utilizing terms such as "processing" or "computing" or "calculating" or "generating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices. Furthermore, the term "computer" is defined to include any digital or analog data processing unit. Examples include any personal computer, workstation, set top box, mainframe, server, supercomputer, laptop or personal digital assistant capable of embodying one or more embodiments of the present invention.

Figure 1:
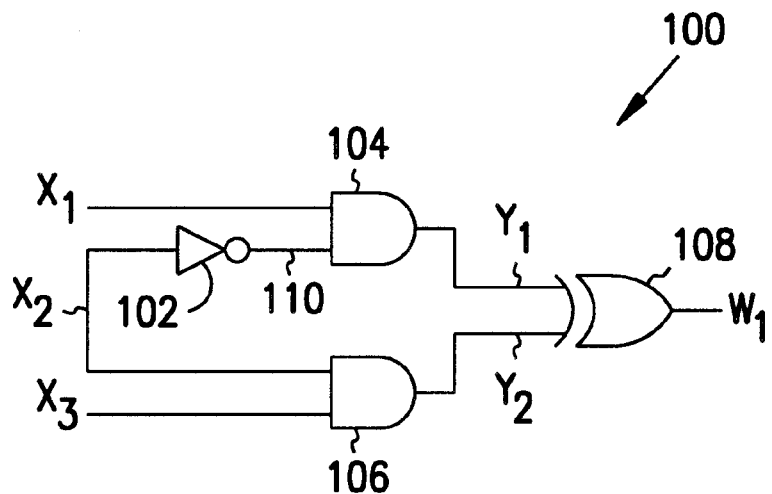
FIG. 1 illustrates an exemplary block logic diagram of a circuit model.
Figure 1:
Figure 2:
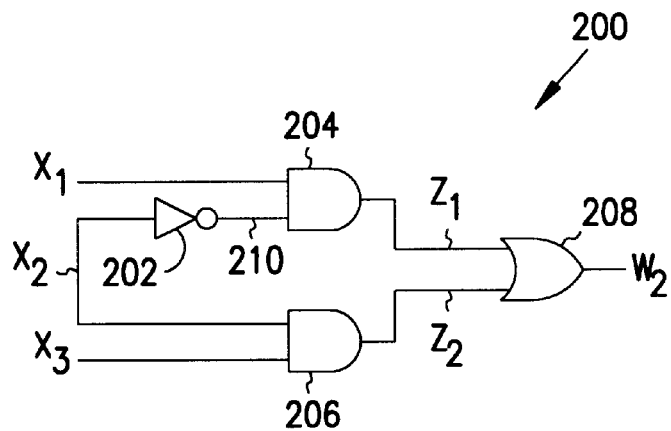
FIG. 2 illustrates an exemplary block logic diagram of another circuit model.

FIGS. 1 and 2 show a pair of example circuit models or circuits 100 and 200 which will be discussed to describe embodiments of the present system. Each circuit 100 and 200 comprises a logic diagram which could have been derived from a register transfer logic (RTL) model, an HDL model, a gate level model, a schematic combinational logic circuit model, or by some other method. The exemplary circuits are merely for explaining embodiments of the present system and in no way are to be understood as limitations.

Circuit 100 includes three inputs $X_1$, $X_2$, and $X_3$, a pair of intermediate signals $Y_1$ and $Y_2$, and an output $W_1$. Circuit 100 includes a logic portion including an inverter 102, a two input AND-gate 104, a two input AND-gate 106, and a two input EXCLUSIVE-OR-gate 108. As noted above, the logic portion of circuit 100 is exemplary, one or more embodiments of the present system are applicable to many different combination of logic gates.

Circuit 200 includes the same inputs $X_1$, $X_2$ and $X_3$, a pair of intermediate signals $Z_1$ and $Z_2$, and an output $W_2$. Circuit 200 includes a logic portion including an inverter 202, a two input AND-gate 204, a two input AND-gate 206, and a two input OR-gate 208. The logic portion of circuit 200 is exemplary, one or more embodiments of the present system are applicable to many different combination of logic gates.

The input, intermediate, and output portions of circuits 100 and 200 will be interchangeably described as nodes, signals, or variables throughout this description, depending on the context.

To better illustrate the false negative problem of conventional cut-point based verification techniques, assume nodes $Y_1$ and $Z_1$ are proven equivalent and that $Y_2$ and $Z_2$ are also proven equivalent. A conventional technique would introduce free variables A for $Y_1$ and $Z_1$, and B for $Y_2$ and $Z_2$. It would then be computed that circuit 100 calculates $W_1 = (A \oplus B)$ as shown in truth table 100a, while circuit 200 calculates $W_2 = (A+B)$ as shown in truth table 200a. (The symbol $\oplus$ stands for an EXCLUSIVE-OR operation, while the + symbol stands for the OR operation). As can be seen from truth tables 100a and 200a, this does not allow us to conclude that the two circuits are functionally equivalent, since different results occur for the signal assignment (1, 1), which is when $(A=Y_1=Z_1=1, B=Y_2=Z_2=1)$.

However, this is actually a false negative since, due to the nature of the logic that generates them, $Y_1$ and $Y_2$ (and $Z_1$ and $Z_2$) cannot both be 1 at the same time (i.e. they are mutually exclusive). This is shown in truth table 200c, in which it is shown that for all combinations of $X_1$, $X_2$, and $X_3$, neither $(Y_1, Y_2)$ nor $(Z_1, Z_2)$ can ever be (1, 1). Thus, circuits 100 and 200 are actually functionally equivalent as shown in truth tables 100b and 200b, and as shown in the two rightmost columns of FIG. 200c. Conventional cut-point techniques perform a time-consuming false-negative elimination step that, if successful, will determine if the circuits are functionally equivalent.

However, in accord with one or more embodiments of the present invention, the false negative problem is eliminated altogether by introducing functions that capture signal relations when breaking circuits 100 and 200 at $(Y_1, Z_1)$ and at $(Y_2, Z_2)$, instead of just introducing free variables A and B. For instance, one signal relation that is captured is the one created by the reconverging fanout of signal $X_2$. A reconverging signal is a signal that has a fanout leading to the circuit's output by going outside of the logic cone of the cut-point signal. On the other hand, a non-reconverging signal is a signal that does not have a fanout leading outside of the logic cone of the cut-point signal as it goes toward the circuit's output. For instance, signal $X_2$ is a reconverging signal in regards to points $Y_1$, $Y_2$, $Z_1$, and $Z_2$, while $X_1$ and $X_3$ are non-reconverging signals. The exemplary method captures the effect of the reconverging signal so that the function that is substituted for a given cut-point node does not lead to false negatives. Thus, one or more embodiments of the present system do not need to perform a time-consuming false negative elimination step.

Figure 3:
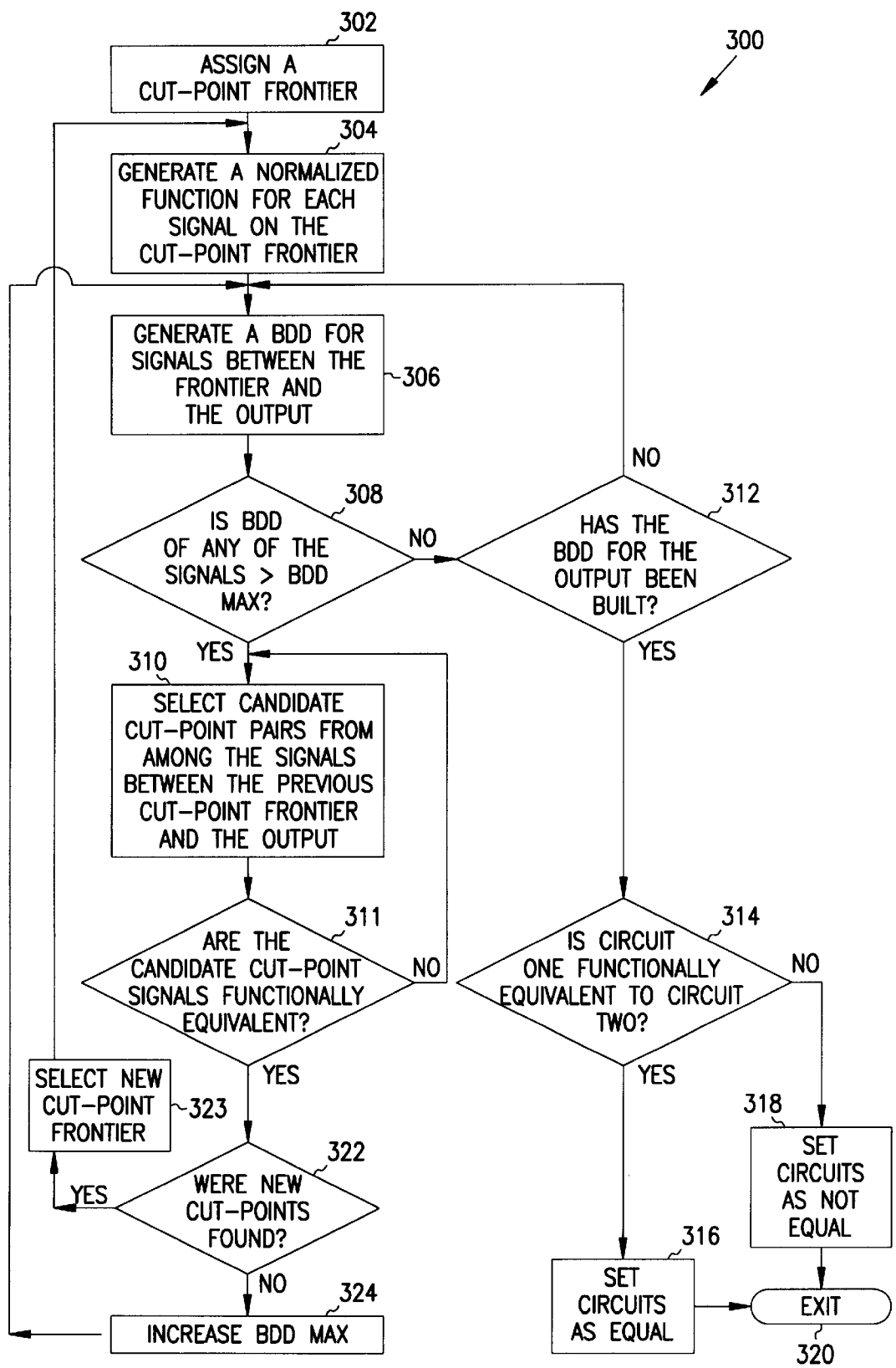
FIG. 3 is a flow chart of a method according to one embodiment of the present invention for comparing two circuit models of FIGS. 1 and 2.

FIG. 3 shows a flowchart of a method 300 for formal verification in accordance with one embodiment of the present invention. Method 300 includes a series of blocks 302–324. It is noted that blocks 302–324 are numbered for sake of convenience, and that in some embodiments the blocks are in other orders and in some embodiments various blocks are omitted.

In block 302, method 300 assigns an initial cut-point signal frontier to each of the circuit models. In the exemplary embodiment, this includes selecting at least one cut-point signal pair for the corresponding inputs of each circuit model. For example, referring to circuits 100 and 200, a first cut-point frontier is assigned across primary inputs $X_1$, $X_2$, and $X_3$ of each circuit 100 and 200. Some embodiments delay assigning a cut-point frontier until it is certain that the circuits are too large for conventional BDD comparison methods.

In block 304, method 300 generates a normalized function for each signal on the cut-point signal frontier. A normalized function captures the relationship between any reconverging signals (such as the reconverging fanout of signal $X_2$ of FIGS. 1 and 2) and the cut-point signal or node which is being normalized. Further details of normalized functions will be discussed below for FIG. 4.

In block 306, the method generates a function for one or more of the signals or nodes lying past the cut-point frontier towards the outputs of the circuits. In the exemplary method, the function generated is stored as a BDD. The normalized functions of the cut-point signals on the cut-point frontier are used to compute the BDDs of signals that are derived from the cut-point frontier. Thus, the BDD of each signal incorporates the information of any normalized functions preceding it. Again, in reference to FIGS. 1 and 2, it can be imagined that circuit 100 (and/or 200) is a piece of a larger circuit and that $X_1$, $X_2$, and $X_3$ lie on a cut-point frontier. The present embodiment generates functions, stored as BDDs, for nodes $Y_1$, $Y_2$, $Z_1$, $Z_2$, $W_1$ and $W_2$.

At block 308, method 300 inquires whether any of the BDDs of any of the signals of block 306 has reached a predetermined maximum size limit, called BDD MAX. In various embodiments, BDD MAX varies depending on available computer memory and/or the suspected degree of similarity of the circuit models being compared.

For sake of description, it will be assumed that the BDDs for $Y_1$, $Y_2$, $Z_1$, and $Z_2$ have not reached the BDD maximum size limit, BDD MAX. Thus, block 308 branches to block 312, which inquires whether the BDDs for the output have been built. If not, block 312 loops back to block 306 and additional BDDs are generated. Here, it will be assumed that the BDDs of nodes $W_1$ and $W_2$ are above the predetermined BDD size. In this case, block 308 branches to block 310.

In blocks 310 and 311, method 300 selects a new cut-point signal frontier among the signals lying between the previous cut-point signal frontier and the output of each circuit model.

In block 310, the method selects candidate pairs of signals of each circuit model having identical functions which are closer to the output of each circuit model. Some exemplary methods of choosing cut-point candidate pairs include random simulation or automatic test pattern generation (ATPG). Some embodiments omit block 310 and go directly to block 311 to compare the BDDs of signals generated in block 306 for equivalence.

In block 311, the cut-point candidates are compared to determine functional equivalence. If equivalent, the cut-point candidate pair is considered for inclusion in the next cut-point frontier in block 323. In the exemplary embodiment, the cut-points are compared by checking the BDD of one cut-point in one circuit model against the BDD of the other cut-point in the other circuit model. Another embodiment determines equivalence by forming an EXCLUSIVE-OR of the BDDs of the cut-points. If a BDD having a constant zero or a constant one value is built then the candidate pair is valid, indicating either equivalence or inversion. If the candidate pair BDD is neither the constant zero nor the constant one function, the cut-point pair is invalid.

If in block 311, the candidate cut-point pair is inequivalent, the cut-point pair is discarded. There is no need to do a false negative check because one or more embodiments of the present system do not create false negatives. For example, ($Y_1$, $Z_1$), and ($Y_2$, $Z_2$) would be chosen as the new cut-point frontier of circuits 100 and 200. However, if $Y_1$ and node 210 had been chosen for cut-point pair candidacy and found to be inequivalent then the exemplary method does not need to do a false negative test, since all the relevant information is already contained in the normalized function of the initial cut-point frontier signals. By not having to perform a false negative check the exemplary method is able to compare circuits faster than conventional methods.

In block 322, the method tests whether new cut-points have been found in block 311. If no new cut-points were found, method 300 increases the size limit of BDD MAX in block 324 and the method loops up to block 306 to continue.

However, if new cut-points were found, block 322 branches to block 323, where a new frontier is selected. Then block 323 loops back to block 304 and continues from there, so that a normalized function is generated for each of the signals on the new cut-point frontier. Thus, referring to FIGS. 1 and 2, normalized functions are developed for $Y_1$, $Y_2$, $Z_1$, and $Z_2$.

In block 306, the method continues by generating the BDD for the function of each of the plurality of signals lying ahead of the new cut-point frontier towards the output of each circuit model.

Subsequently, it is assumed that the sizes of all BDDs are less than the BDD MAX size limit and the method reaches 312. It will be assumed that $W_1$ and $W_2$ which are the outputs of the circuits, have their respective BDDs now built. It is noted that exemplary circuits 100 and 200 can also be thought of as smaller parts of a larger circuit.

In block 314, method 300 compares the circuits by comparing the BDDs for the outputs. If the circuits are determined to be equivalent, they are set or declared as equivalent in block 316 and the method exits. If the circuits are determined to be inequivalent, they are set or declared as inequivalent in block 318 and the method exits at block 320. Again, it is noted that the present method does not require doing a false negative check when a result is negative.

This will be illustrated by referring again to the circuit diagrams 100 and 200 from FIGS. 1 and 2. In block 304, the exemplary method sets $Y_1$ and $Z_1$ to their normalized function $Y_1 \cdot X_2'$. Similarly, $Y_2$ and $Z_2$ would be set to $Y_2 \cdot X_2$ (see details below). In block 314, when the circuits are compared, function $W_1$ becomes $Y_1 \cdot X_2' \oplus Y_2 \cdot X_2$ for circuit 100, and $W_2$ becomes $Y_1 \cdot X_2' + Y_2 \cdot X_2$. for circuit 200. These two expressions are clearly equal since the two terms comprising them cannot be 1 at the same time. Truth tables 100b and 200b show a visual example of the result.

Advantageously, since signals $Y_1$, $Y_2$, $Z_1$, and $Z_2$ were normalized, a false negative result cannot be reached as in conventional techniques. As a result, if the outputs of the circuits that are being compared were not found to be equal, the exemplary method does not need to do a false negative check.

If $W_1$ and $W_2$ were not the outputs, method 300 would continue generating new cut-point frontiers until the output is reached.

Below is a pseudo-code representation describing the operation of one embodiment of method 300:

| | |
|---|---|
| Block 302: | The initial cut-point frontier across the two circuits being compared is formed at the primary inputs. |
| Block 304: | Generate the normalized functions of the signals on the cut-point frontier. |
| Blocks 306–308: | Assign to each signal in the frontier its normalized function and based on this compute the function of as many signals as possible lying past the frontier towards the output. Stop computing functions whenever the BDD representing one of them exceeds a preset size limit of BDD MAX. |
| Blocks 312–320: | If the functions of the outputs are computed and are equal then EXIT after declaring that the circuits are EQUAL. If the output functions are different EXIT after declaring that the Circuits are NOT EQUAL. If the functions of the outputs are not computed, loop back to block 306 and continue calculating BDDs until all BDDs are calculated or until BDD MAX is reached. |
| Steps 310–324: | If the output functions are not calculated yet and BDD MAX has been reached, select a new frontier of cut-points from among pairs of signals with identical functions closer towards the outputs and GOTO Block 304. If such signals do not exist, then increase the size limit of BDD MAX and GOTO Block 306. |

Figure 4:
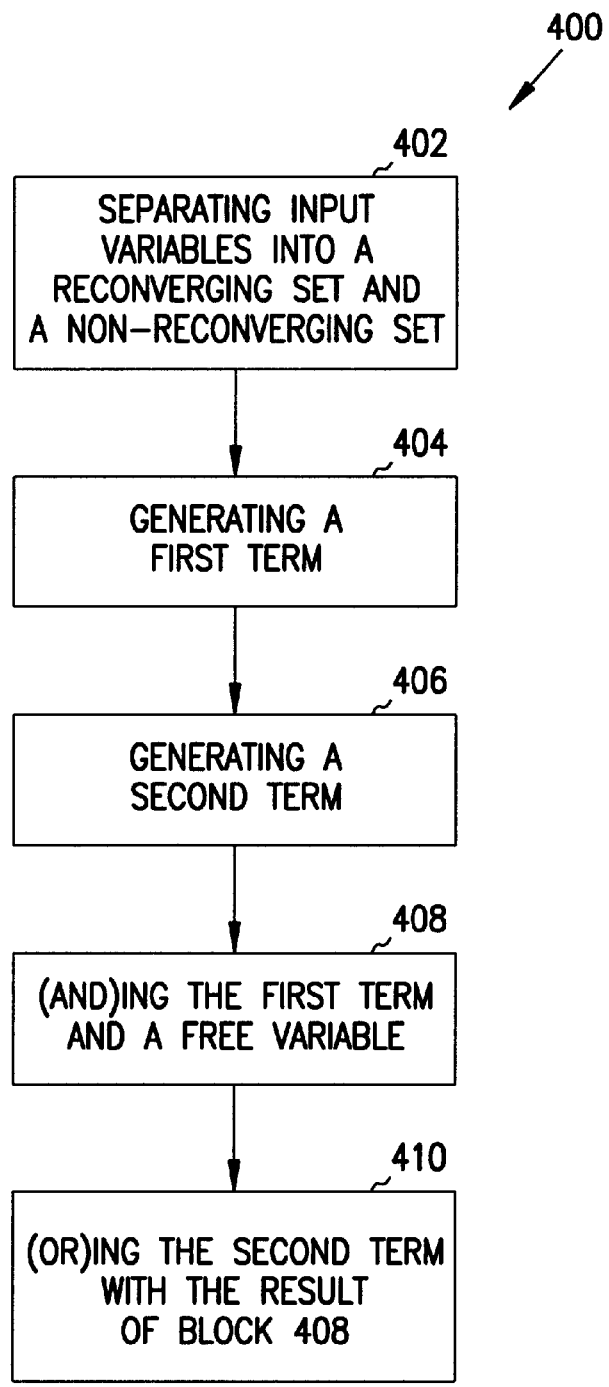
FIG. 4 is a flow chart of a method of generating a normalized function in accordance with one embodiment of the present invention.

FIG. 4 shows a method 400 of generating a normalized function according to one embodiment. Method 400 includes blocks 402–410. Again, it is noted that blocks 402–410 are numbered for ease of description and that some embodiments change the order of the blocks and some embodiments omit one or more blocks.

Method 400 will be described by referring to circuits 100 and 200 of FIGS. 1 and 2. Specifically, the method will be described in terms of generating the normalized functions of nodes or signals $Y_1$, $Y_2$, $Z_1$, and $Z_2$. As discussed above, a normalized function is a function that incorporates or captures the effect of a reconverging signal on the cut-point signal. Also as described above, a reconverging signal is a signal that has a fanout leading outside of the logic cone of the cut-point signal to reach the output while bypassing the cut-point. A non-reconverging signal is a signal that does not have a fanout leading outside of the logic cone of the cut-point signal. For instance, signal $X_2$ is a reconverging signal in regards to cut-points $Y_1$ and $Y_2$, in circuit 100, and to cut-points $Z_1$ and $Z_2$ in circuit 200. On the other hand, $X_1$ and $X_3$ are non-reconverging signals.

For description purposes, $X_1$, $X_2$, $X_3$ can be considered as belonging to a previous cut-point frontier. Similarly, $Y_1$, $Y_2$, $Z_1$, and $Z_2$ can be considered as cut-points belonging to the present cut-point frontier that will be used to calculate additional cut-point frontiers which will eventually include $W_1$ and $W_2$. The logic gates 102, 104, 106, and 202, 204, and 206 from $X_1$, $X_2$, and $X_3$ that generate $Y_1$, $Y_2$, $Z_1$, and $Z_2$, implement logic functions collectively denoted by the symbol g(<s>). Here <s> is a vector variable corresponding to the signals $X_1$, $X_2$, and $X_3$ of a cut-point frontier.

In block 402, method 400 separates the input vector variable, <s>, into two sets. A first set, which includes the reconverging vector variables, <r>, and a second set, which includes the non-reconverging vector variables, <n>. In circuits 100 and 200, <r> is $X_2$, and <n> is $X_1$ and $X_3$.

In block 404, method 400 generates a first term that captures the values of the reconverging variables for which the cut-point may assume a value different from 0 (zero) given suitable value assignments to the non-reconverging variables. This first term is called the possible term and is denoted with the symbol $P_g$.

In one embodiment, the possible term, $P_g$, is computed by existentially quantifying out the non-reconverging variables from the cut-point function. This operation is comparable to generating partial terms for the value of the cut-point function for each of the possible value assignments to the non-reconverging variables, and performing the Boolean OR operation on these partial terms. Although one or more embodiments of the present system are implemented in terms of existential quantification, which is an efficient operation, for the sake of description, the possible term is presented in terms of Boolean ORing.

An exemplary formula for deriving the possible term is $P_g = P_g(<r>) = \Sigma g(<r>,<n>)$ for all $\{<n>\} = \exists <n>, g(<r>,<n>)$, where $\{<n>\}$ stands for all the $2^m$ boolean logic value combinations that the $<n> = (n_1, n_2, \ldots, n_m)$ can assume, and where summation ($\Sigma$) corresponds to Boolean ORing. Furthermore, the $\exists$ symbol stands for existential quantification.

The formula will be illustrated using the examples of FIGS. 1 and 2, in which $X_2$ is the re-converging variable $<r>$ and $X_1$ and $X_3$ are non-reconverging variables $<n>$ on the previous cut-point frontier, $X_1$, $X_2$, $X_3$. The value of the possible term, $P_g$, for $Y_1$ and $Z_1$ is assigned as follows, since $g(<r>,<n>) = X_1 \cdot X_2'$ is their cut-point function:

$$P_g = P_g(<r>) = \tau g(<r>,<n>) \text{ for all } \{<n>\} = \exists <n>, g(<r>,<n>).$$

So, when $<n> = X_1 = 1$, $g(<r>,<n>) = 1 \cdot X_2'$. When $<n> = 0$, $g(<r>,<n>) = 0 \cdot X_2'$.
Thus, $$P_g = (1 \cdot X_2') + (0 \cdot X_2') = X_2'.$$

The possible terms of nodes $Y_2$ and $Z_2$ are $P_g = (1 \cdot X_2) + (0 \cdot X_2) = X_2$.

In block 406, method 400 generates a second term that captures the reconverging variable values that make the cut-point signal 1 (one) independently of the value of any of the non-reconverging variables, in effect forcing it to 1. The second term is therefore called the forced term, $F_g$. The forced term captures the $<r>$ values for which, for every value combination of the $<n>$ variables, the cut-point signal becomes 1.

In one example method, the forced term is computed by universally quantifying out the non-reconverging variables from the cut-point function. This is comparable to generating partial terms by computing the value of the cut-point function for each possible value assignment of the non-reconverging variables, and performing a boolean AND operation on these partial terms. The universal quantification is employed in one or more embodiments, since it is an efficient operation, but for the sake of the present description, the forced term is presented in terms of the Boolean ANDing.

An exemplary formula for generating the forced term is $F_g = F_g(<r>) = \Pi g(<r>,<n>)$ for all $\{<n>\} = \forall <n>, g(<r>,<n>)$, where $\{<n>\}$ stands for all the $2^m$ boolean logic value combinations that the $<n> = (n_1, n_2, \ldots, n_m)$ can assume, and where multiplication ($\Pi$) corresponds to Boolean ANDing. The symbol $\forall$ stands for universal quantification.

This will be illustrated using again the examples of FIGS. 1 and 2, in which $X_2$ is the re-converging variable $<r>$ and $X_1$ is a non-reconverging variable $<n>$ on the previous cut-point frontier for the $Y_1$ and $Z_1$ cut-points. The value of the forced term, $F_g$, for $Y_1$ and $Z_1$ is as follows:

When $<n> = X_1 = 1$, $g(<r>,<n>) = 1 \cdot X_2'$. When $<n> = X_1 = 0$, $g(<r>,<n>) = 0 \cdot X_2'$. Thus, $$F_g = (1 \cdot X_2') \cdot (0 \cdot X_2') = 0.$$

The forced term of $Y_2$ and $Z_2$ is similarly computed as $F_g = (1 \cdot X_2) \cdot (0 \cdot X_2) = 0$.

In block 408, method 400 generates a third term by Boolean ANDing a free variable (also called an eigenvariable) and the first term (the possible term). The free variable is ANDed with the possible term to capture the effect of when, for a specific $<r>$ variable value combination, some combination of the $<n>$ variables make the cut-point signal 1 (one) and some make it 0 (zero). Referring to FIGS. 1 and 2, the free variables will be called $Y_1$ (for nodes $Y_1$ and $Z_1$) and $Y_2$ (for nodes $Y_2$ and $Z_2$).

In block 410, the method generates the normalized function by Boolean ORing the second term with the third term.

An exemplary overall formula for generating a normalized function, V, for a cut-point signal, v, is as follows:

$$V = v \cdot P_g + F_g = v \cdot \Sigma g(<r>,<n>) + \Pi g(<r>,<n>) \text{ (for all } \{n\}).$$

where v is the free variable or eigenvariable.

To recap and to illustrate we again use FIGS. 1 and 2. The value of the normalized function, V, of $Y_1$ and $Z_1$ is assigned as follows:

the forced term $F_g = (1 \cdot X_2') \cdot (0 \cdot X_2') = 0$.

the possible term $P_g = 1 \cdot X_2' + 0 \cdot X_2' = X_2'$.

The free variable is $Y_1$. So here, the normalized function for $Y_1$ and $Z_1$ is $Y_1 \cdot X_2' + 0 = Y_1 \cdot X_2'$.

The normalized function for $Y_2$ and $Z_2$ is:

$$V = v \cdot \Sigma g(<r>,<n>) + \Pi g(<r>,<n>) \text{ (for all } \{<n>\}) = v \cdot (1 \cdot X_2 + 0 \cdot X_2) + ((1 \cdot X_2) \cdot (0 \cdot X_2)) = Y_2 \cdot (X_2 + 0) + (0) = Y_2 \cdot X_2.$$

Thus, as noted above, function $W_1$ becomes $Y_1 \cdot X_2' \oplus Y_2 \cdot X_2$, while $W_2$ becomes $Y_1 \cdot X_2' + Y_2 \cdot X_2$. These two expressions are equal since the two terms comprising them cannot be 1 at the same time. Again, truth tables 100b and 200b show the result.

In summary, the problem of the false negatives in a formal verification process appears when the technique that compares two circuits or logic diagrams classifies them as different, while in reality they are not. In the case of tools based on cut-points this happens because introduction of free variables for equivalent cut-points hides the relationships between signals in the circuits, which leads to inaccuracies in the comparison of the circuits. One or more embodiments of the present system introduce cut-points into the circuits in such a way that relevant information is not lost and the answer for the comparison is correct.

This leads to a simpler algorithm, since it is not necessary to perform a final false negative elimination step with potentially very expensive BDD operations. Thus, the present system can handle circuits without the appearance of false negatives.

Moreover, it has been empirically determined that the size of a normalized function generated by exemplary method 400 is almost always smaller than the size of the original function that it replaces. Only when all the variables of a function are reconverging is the normalized function identical to the original one.

The various methods discussed above may be implemented either within dedicated hardware or within processes implemented within a data processing system. A typical hardware configuration of a computer system which may be implemented to accomplish the methodologies disclosed herein is illustrated in FIG. 5.

Figure 5:
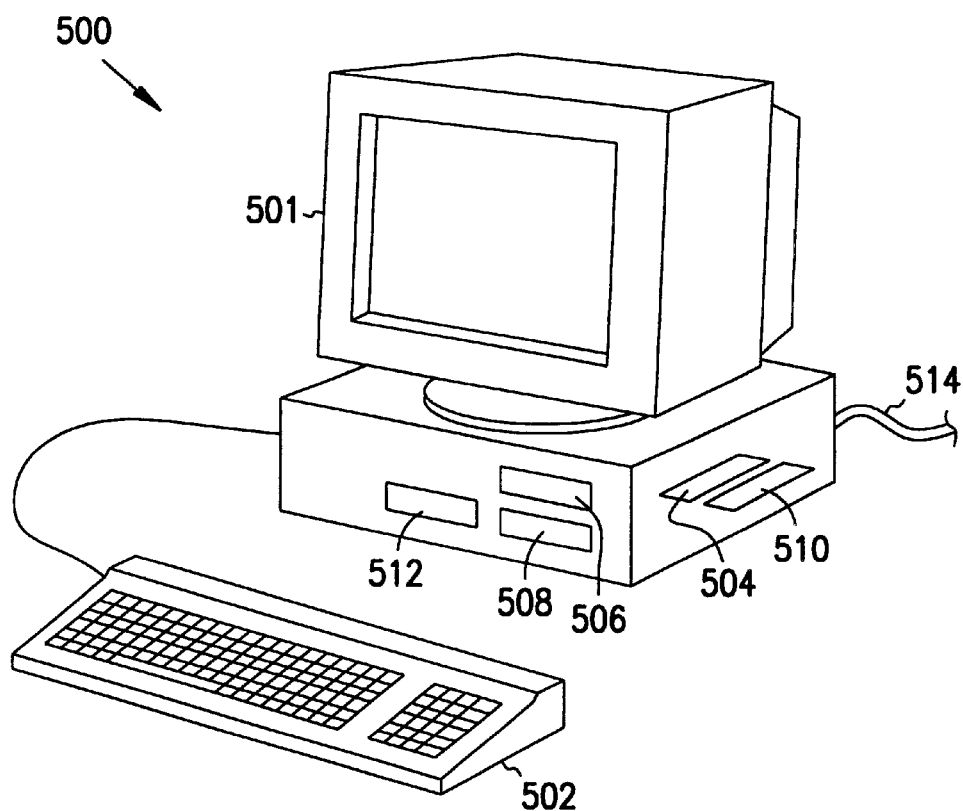
FIG. 5 is a generalized isometric view of an exemplary computer system for implementing the methods of FIGS. 3 and 4.

FIG. 5 shows a generalized isometric view of a computer system 500 in accordance with one embodiment of the present invention. The invention is not so particularly limited, however, as those of ordinary skill in the art can appreciate.

Computer systems as shown in FIG. 5 typically include a monitor 501, keyboard input 502, and a central processing unit 504, and a memory 510. Further components of a typical computer system may include a computer-readable storage media such as hard disk drive 506, floppy disk drive 512, CD-ROM 508, DVD, modem connected to network by input/output line 514, or a flash memory device or any other read-write or read-only memory device. Processor unit 504 of such a computer typically includes a microprocessor, memory (RAM and ROM), and other peripheral circuitry, not shown. The various machine readable storage media provide information to memory 510 and processor 504. Processor 504 is capable of decoding and executing a computer program such as an application program or operating system with instructions from multiple instruction sets that may be stored on media or in memory.

The exemplary methods disclosed herein may generate computer aided design (CAD) data files which contain information regarding an integrated circuit and placement of gates, transistors and the like in an integrated circuit. Specifically, the exemplary method may be used to verify optimization of a circuit layout or design specification model. In other embodiments, the exemplary techniques may be implemented as part of a Boolean reasoning engine providing operations for Boolean function manipulation and comparison. In yet other embodiments, the exemplary methods discussed above may be used in other computer-aided design applications including logic synthesis and testing.

Moreover, one or more embodiments can be used across a variety of microprocessor designs for performing the formal verification activity and the present invention is not limited by any description herein, but only by the claims.

CONCLUSION

Formal verification tools are often based on binary decision diagrams (BDDs). BDD techniques suffer from exponential memory requirements since the size of the BDD representing a given circuit can grow exponentially relative to the inputs of the circuit. To overcome this, solutions based on a cut-points approach have been developed. However, one problem that arises when introducing cut-points into circuit models is that the verification method may return a false negative. False negatives appear when the technique that compares the two circuits classifies them as different, while in reality they are not.

Accordingly, methods and systems have been devised to eliminate the false negative problem. An exemplary method includes generating a BDD for each of a plurality of signals of each circuit model from an initial cut-point frontier towards an output of each circuit model until a BDD of one of the plurality of signals reaches a predetermined maximum size, selecting a new cut-point signal frontier, and generating a normalized function for each cut-point signal on the new cut-point frontier of each circuit model.

It is understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method of comparing two circuit models, the method comprising:

generating a binary decision diagram (BDD) for one or more of a plurality of signals of each circuit model from a first cut-point frontier of each circuit model towards an output of each circuit model;

comparing the two circuits if the BDD for the output of each circuit is built before the BDD of one of the plurality of signals reaches a predetermined maximum size;

selecting a second cut-point signal frontier between the first cut-point signal frontier and the output of each circuit model if the BDD of one of the plurality of signals reaches the predetermined maximum size; and generating a normalized function for each of a plurality of signals on the second cut-point frontier of each circuit model.

2. The method of claim 1, further comprising repeatedly generating a BDD for one or more of a plurality of signals of each circuit model from the second cut-point frontier towards the output of each circuit model; selecting a third and further cut-point signal frontiers between a previous cut-point signal frontier and the output of each circuit model if the BDD of one of the plurality of signals reaches the predetermined maximum size; and generating a normalized function for each of a plurality of signals on the third and further cut-point frontiers until the output of each circuit is reached.

3. The method of claim 1, wherein selecting a second cut-point signal frontier comprises:

determining the functional equivalence of a candidate cut-point signal pair; and assigning each of the signals of the candidate cut-point signal pair to the second cut-point signal frontier of each circuit model if the candidate cut-point signal pair are equivalent;

a false negative check not being performed if the candidate cut-point signal pair are not equivalent.

4. The method of claim 1, wherein generating a normalized function for a signal on the second cut-point frontier comprises generating a function incorporating an effect of a reconverging fanout signal on the signal on the second cut-point frontier.

5. The method of claim 1, wherein generating a normalized function for a signal comprises:

separating one or more input variables of the signal into a first set comprising reconverging variables and a second set comprising non-reconverging variables;

generating a first term that captures any of the reconverging variables that make the signal different from 0 (zero) given suitable values of the non-reconverging variables;

generating a second term that captures any of the reconverging variables that make the signal 1 (one) independently of the value of any of the non-reconverging variables;

generating a third term by ANDing a free variable and the first term; and

ORing the second term with the third term.

6. The method of claim 5, wherein generating the first term comprises:

existentially quantifying out the non-reconverging variables.

7. The method of claim 5, wherein generating the second term comprises:
   universally quantifying out the non-reconverging variables.

8. The method of claim 1, wherein selecting the second cut-point signal frontier comprises comparing a pair of cut-point signal candidates to each other without doing a false negative check if they are not equivalent.

9. The method of claim 1, further comprising increasing the size of the predetermined maximum size if a second cut-point frontier is not selected.

10. The method of claim 1, wherein comparing the two circuits comprises determining whether the circuits are functionally equivalent.

11. The method of claim 1, wherein selecting the second cut-point signal frontier comprises selecting pairs of signals of each circuit model having functional equivalence.

12. The method of claim 1, further comprising generating a normalized function for each of a plurality of signals on an initial cut-point frontier of each circuit model.

13. An article including a computer readable medium having instructions thereon, wherein the instructions, when executed on a computer, create a system for executing a method comprising:
   generating a binary decision diagram (BDD) for one or more of a plurality of signals of each circuit model from a first cut-point frontier of each circuit model towards an output of each circuit model;
   comparing the two circuits if the BDD for the output of each circuit is built before the BDD of one of the plurality of signals reaches a predetermined maximum size;
   selecting a second cut-point signal frontier between the first cut-point signal frontier and the output of each circuit model if the BDD of one of the plurality of signals reaches the predetermined maximum size; and
   generating a normalized function for each of a plurality of signals on the second cut-point frontier of each circuit model.

14. The article of claim 13, wherein selecting the second cut-point signal frontier comprises:
   determining the equivalence of a candidate cut-point signal pair; and
   assigning each of the signals of the candidate cut-point signal pair to the new cut-point signal frontier of each circuit model if the signals of the candidate cut-point signal pair are equivalent;
   a false negative check not being performed if the signals of the candidate cut-point signal pair are not equivalent.

15. The article of claim 13, wherein generating the normalized function of a signal comprises generating a function incorporating an effect of a reconverging variable on the signal.

16. The article of claim 13, wherein generating the normalized function comprises:
   separating one or more input variables of a signal into a first set comprising reconverging variables and a second set comprising non-reconverging variables;
   generating a first term that captures any of the reconverging variables that make the signal different from 0 (zero) given suitable values for the non-reconverging variables;
   generating a second term that captures any of the reconverging variables that make the signal 1 (one) independently of the value of any of the non-reconverging variables;
   generating a third term by ANDing a free variable and the first term; and
   ORing the second term with the third term.

17. A method of introducing a cut-point into a circuit model, the cut-point having one or more input signals, the method comprising:
   assigning a function to the cut-point, the function incorporating an effect of any reconverging input signals on a value of the cut-point.

18. The method of claim 17, wherein the function is generated by:
   separating the one or more input signals of the cut-point into a first set comprising reconverging signals and a second set comprising non-reconverging signals;
   generating a first term that captures any of the reconverging signals that make the cut-point different from 0 (zero) given suitable value assignments to the non-reconverging signals;
   generating a second term that captures any of the reconverging signals that make the cut-point 1 (one) independently of the value of any of the non-reconverging signals;
   generating a third term by ANDing a free variable and the first term; and
   ORing the second term with the third term.

19. The method of claim 18, wherein generating the first term comprises existentially qualifying out the non-reconverging signals, and wherein generating a second term comprises universally quantifying out the non-reconverging signals.

20. A method of determining equivalence between two logic models, the method comprising:
   generating a binary decision diagram (BDD) of one or more nodes of each logic model from an input of each logic model to an output of each logic model until the BDD of one of the nodes reaches a predetermined maximum size or until a BDD for the output is built;
   choosing a plurality of candidate cut-point node pairs if the BDD of one of the nodes reaches the predetermined maximum size;
   determining a functional equivalence between the candidate cut-point signal node pairs;
   selecting a plurality of cut-point signal node pairs as a new cut-point frontier;
   generating a normalized function for each of the plurality of nodes on the new cut-point frontier of each logic model; and
   repeatedly generating BDDs, choosing a plurality of cut-point node pairs, selecting a plurality of cut-point signal node pairs as a new cut-point frontier, and generating a normalized function for each of the plurality of nodes on the new cut-point frontier, until the BDD for the output of each circuit is reached.

21. The method of claim 20, wherein if the signals of a candidate cut-point node pair are not equivalent, the candidate node pair is discarded without doing false negative checking.

22. The method of claim 20, wherein generating the normalized function comprises:
   separating one or more input variables of a node into a first set comprising reconverging variables and a second set comprising non-reconverging variables;
   generating a first term that captures any values of the reconverging variables that make the node different from 0 (zero) given suitable value assignments to the non-reconverging variables;

generating a second term that captures any values of the reconverging variables that make the node 1 (one) independently of a value of any of the non-reconverging variables;

generating a third term by ANDing a free variable and the first term; and

ORing the second term with the third term.

23. A method of assigning a function to a cut-point variable having one or more input variables, the method comprising:

separating the one or more input variables into a first set comprising reconverging variables and a second set comprising non-reconverging variables;

generating a first term that captures any values of the reconverging variables that make the cut-point variable different from 0 (zero) given suitable value assignments to the non-reconverging variables;

generating a second term that captures any values of the reconverging variables that make the cut-point variable 1 (one) independently of the value of any of the non-reconverging variables;

generating a third term by ANDing a free variable and the first term; and

ORing the second term with the third term.

24. The method of claim 23, wherein generating the first term comprises existentially quantifying out the non-reconverging variables.

25. The method of claim 23, wherein generating the second term comprises universally quantifying out the non-reconverging variables.

26. A system comprising:

a computer having a central processing unit; and a computer readable medium having instructions for instructing the central processing unit to determine equivalence between two circuit models by performing a method comprising:

generating a binary decision diagram (BDD) for one or more of a plurality of signals of each circuit model from a first cut-point frontier of each circuit model towards an output of each circuit model;

comparing the two circuits if the BDD for the output of each circuit is built before the BDD of one of the plurality of signals reaches a predetermined maximum size;

selecting a second cut-point signal frontier between the first cut-point signal frontier and the output of each circuit model if the BDD of one of the plurality of signals reaches the predetermined maximum size; and generating a normalized function for each of a plurality of signals on the second cut-point frontier of each circuit model.

27. The system of claim 26, wherein generating the normalized function of a signal comprises generating a function incorporating an effect of a reconverging fanout variable on the signal.

28. The system of claim 26, wherein generating the normalized function of a signal comprises:

separating one or more input variables of the signal into a first set comprising reconverging variables and a second set comprising non-reconverging variables;

generating a first term that captures any values of the reconverging variables that make the signal different from 0 (zero) given suitable value assignments to the non-reconverging variables;

generating a second term that captures any values of the reconverging variables that make the signal 1 (one) independently of the value of any of the non-reconverging variables;

generating a third term by ANDing a free variable and the first term; and

ORing the second term with the third term.

* * * * *